United States Patent
Mayer et al.

(10) Patent No.: US 7,970,364 B2
(45) Date of Patent: Jun. 28, 2011

(54) STRATEGY FOR USING THE ENVELOPE INFORMATION WITHIN A CLOSED LOOP POWER CONTROL SYSTEM

(75) Inventors: Christian Mayer, Linz (AT); Andreas Schwarz, Rohrbach OOE (AT); Nick Shute, Munich (DE); Günter Märzinger, Linz (AT); Andrea Camuffo, Munich (DE); Bernd Adler, Neubiberg (DE); Michael Meixner, Erlangen (DE); Peter Bundgaard, Aalborg (DK)

(73) Assignee: Infineon Technologies AG, Neubiberg (DE)

( * ) Notice: Subject to any disclaimer, the term of this patent is extended or adjusted under 35 U.S.C. 154(b) by 601 days.

(21) Appl. No.: 12/130,835

(22) Filed: May 30, 2008

(65) Prior Publication Data

US 2009/0298448 A1 Dec. 3, 2009

(51) Int. Cl.
*H04B 1/04* (2006.01)
(52) U.S. Cl. ....... 455/127.2; 455/522; 455/69; 455/138; 455/418
(58) Field of Classification Search .............. 455/13.4, 455/115.1, 127.2, 134, 135, 136, 138, 140, 455/141, 144, 146, 147, 151.4, 220, 341, 455/343.1, 69, 522, 572, 78, 550.1, 333, 68, 126, 127.1, 418; 369/47.53; 375/297, 300; 370/279
See application file for complete search history.

(56) References Cited

U.S. PATENT DOCUMENTS

| | | | |
|---|---|---|---|
| 2005/0009480 A1* | 1/2005 | Vakilian et al. | 455/127.2 |
| 2007/0072577 A1* | 3/2007 | Rozenblit et al. | 455/333 |
| 2007/0268846 A1* | 11/2007 | Proctor et al. | 370/279 |
| 2008/0101185 A1* | 5/2008 | Rozenblit et al. | 369/47.53 |

* cited by examiner

*Primary Examiner* — Tan Trinh
(74) *Attorney, Agent, or Firm* — Eschweiler & Associates, LLC (57) ABSTRACT

A power control system includes a reference path filter used to suppress high frequencies in an input signal and generate a filtered envelope signal, a reference path amplifier to scale the filtered input signal based on a gain signal and generate a reference signal, a signal path amplifier to amplify an RF modulated signal and generate a signal path output signal scaled by a gain of an actuator signal, and a power detector to detect a power associated with the signal path output signal. The system includes an ADC to receive, pre-filter and convert the detected envelope signal into a measurement signal, and a comparator block to receive the reference signal and the measurement signal, and generate an error signal based on the difference, and a controller to generate the actuator signal for controlling the gain of the signal path amplifier based on the error signal.

22 Claims, 5 Drawing Sheets

STRATEGY FOR USING THE ENVELOPE INFORMATION WITHIN A CLOSED LOOP POWER CONTROL SYSTEM

BACKGROUND

In the UMTS system, the power of a mobile station (MS) telephone must be tightly controlled so that this level is neither too low nor too high. For example, in a CDMA access system, excess output power of a MS may impede other connections on the same channel.

During a connection, the base station (BS) regularly sends (at a rate of 1.5 kHz) commands to the MS which give a correction to the output power. These commands are defined in 3GPP 25.101 and they are generally communicated at between −3 and +3 dB. The MS is required to effectively and consistently respond with an increase in output power when commanded to output a higher level and vice versa, otherwise the entire channel and all the connections could suffer. Further, step tolerances are specified and the total dynamic range is required to be more than 70 dB.

In the past an open loop concept has generally been used in UMTS telephones; that is, the power was not directly monitored within the telephone hardware.

However, new requirements on tolerances and on effective radiated output power require phone manufacturers to switch to a closed loop approach, in particular, to optimize performance when the antenna is mismatched, while guaranteeing that the specified maximum radiation (SAR) is not overcome. Closed loop systems have long been used in GMSK systems (constant envelope), but their use for UMTS systems is made much more difficult by the presence of wide bandwidth amplitude modulation having a large crest factor as well as requiring that the power stabilize within 50 us.

Accordingly, there is a continued need to improve closed loop power control in UMTS systems.

SUMMARY

The following presents a simplified summary in order to provide a basic understanding of one or more aspects of the disclosure. This summary is not an extensive overview, and is neither intended to identify key or critical elements of the disclosure, nor to delineate the scope thereof. Rather, the primary purpose of the summary is to present some concepts in a simplified form as a prelude to the more detailed description that is presented later.

In one embodiment, a closed loop power control system is disclosed that includes a reference path filter coupled to an input signal, configured to suppress high frequencies in the input signal and to generate a filtered envelope signal. The system also includes a reference path programmable gain amplifier (PGA) coupled to the reference filter and a gain signal, configured to scale the filtered envelope signal based on the gain signal and generate a reference signal therefrom, and a signal path PGA, configured to receive and amplify an RF modulated signal, and generate a signal path output signal scaled by a gain of an actuator signal. The system has a power detector, configured to detect a power associated with the scaled signal path output signal and to generate a detected envelope signal therefrom, and an analog to digital converter (ADC) coupled to the power detector configured to receive, pre-filter and convert the detected envelope signal into a measurement signal. The system also has a comparator block configured to receive the reference signal from the reference path amplifier and the measurement signal from the ADC, and generate an error signal based on the difference between the reference signal and the measurement signal, and a controller coupled between the signal path amplifier and the comparator block, configured to receive the error signal from the comparator block and generate the actuator signal operable to control the gain of the signal path amplifier based on the error signal.

In one embodiment, a method is disclosed for closed loop power control using the slow varying envelope information of an input signal. The method comprises suppressing high frequencies in the input signal to generate a filtered UMTS envelope signal, and amplifying the filtered UMTS envelope signal with a closed loop gain to generate a reference signal therefrom. The method also comprises amplifying an RF modulated signal to generate an amplified output signal scaled by a gain of an actuator signal, and detecting a power associated with the amplified and RF modulated signal to generate a detected envelope signal therefrom. Finally, the method further includes converting the detected envelope signal into a measurement signal, generating an error signal based on a difference between the reference signal and the measurement signal, and generating the actuator signal for controlling the gain of the amplified output signal based on the error signal.

The following description and annexed drawings set forth in detail certain illustrative aspects and implementations. These are indicative of only a few of the various ways in which the principles may be employed.

DETAILED DESCRIPTION

One or more implementations will now be described with reference to the attached drawings, wherein like reference numerals are used to refer to like elements throughout. Systems and methods are disclosed for efficiently amplifying and adjusting the output power of a closed loop power control system employing the slow varying envelope information in the input signal for the power control loop.

Because a UMTS transmitter must maintain accurate absolute power control over the transmission signal (especially on the maximum output power and 20 dB below), there is a continued need to improve power control in UMTS RF power amplifier systems that operate in the GHz spectrum. This level of absolute power control can likely only be met with a closed loop power control system.

Accordingly, a closed loop power control method for RF power amplifiers is provided in one embodiment for closed loop power control of an input signal such as a UMTS input signal based on using the slow varying envelope information. The power control system is suitable for base and mobile stations and other applications that could use such closed loop control of RF power amplifiers.

Figure 1:
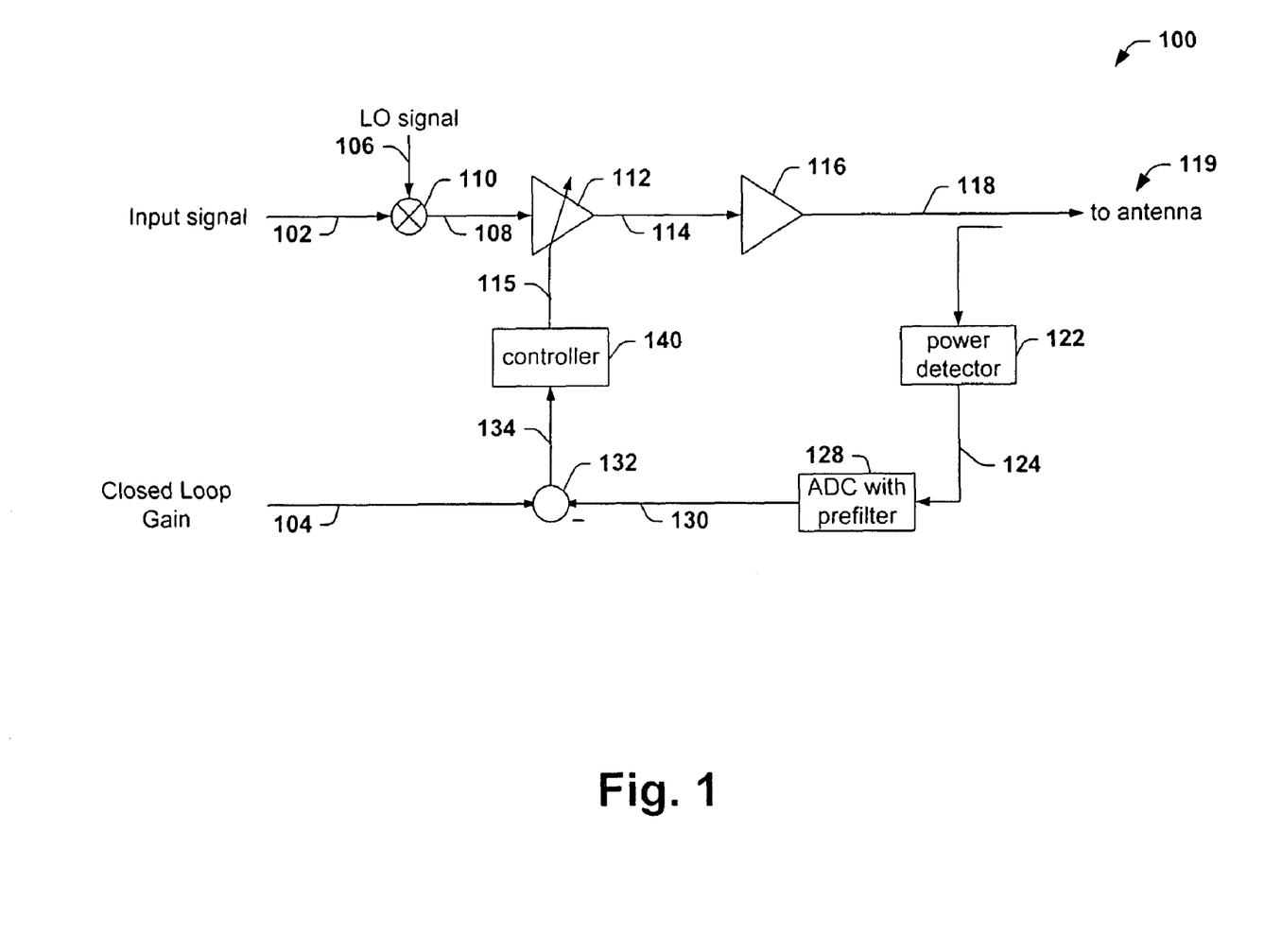
FIG. 1 is a simplified schematic diagram of a closed loop power control system in accordance with one embodiment of the disclosure.

Turning now to FIG. 1, a simplified schematic diagram of a closed loop power control system is illustrated in accordance with one embodiment. In one embodiment, the power control system 100 comprises an input signal 102 (e.g., a UMTS, CDMA, WDCMA, GSM, 3GSM, baseband or digital amplitude information input signal) which is up-converted into a modulated RF signal 108 with an RF local oscillator signal 106 utilizing mixer 110. The modulated RF signal 108 is then amplified using a programmable gain amplifier (PGA) 112 whose gain is controlled by a control signal 115 to provide an amplified RF modulated signal 114. The amplified RF modulated signal 114 is then power amplified by power amplifier (PA) 116 which generates a RF transmission signal 118, for example, which is delivered to an antenna 119.

The power control system 100 also has a power detector 122 that demodulates the RF transmission signal 118 into a detected power signal 124 proportional to the envelope of the RF transmission signal 118. The power control system 100 further includes an analog to digital converter (ADC) 128 coupled to the power detector 122 that pre-filters (e.g., containing an anti-aliasing low pass filter), samples and converts the detected power signal 124 into a measurement signal 130. The power control system 100 also includes a comparator 132 that receives a desired closed loop gain used as a reference signal 104 and the measurement signal 130 from the ADC 128, and generates an error signal 134 based on the difference between the reference signal 104 and the measurement signal 130. Finally, the power control system 100 also has a controller coupled between the PGA 112 and the comparator 132, configured to receive the error signal 134 from the comparator 132 and generate the control signal 115 for control of the gain of the PGA 112.

As long as an error between the reference signal 104 and the measurement signal 130 exists, the control signal 115 is adjusted. However, in the power control solution 100 of FIG. 1, the frequency contents below the loop bandwidth are removed from the RF transmission signal 118 delivered to the antenna 119 due to the closed loop operation. For some UMTS constellation signals this may have a large impact on the quality of the modulated UMTS signal at the antenna, for example, poor quality of output at the antenna, and poor spectral performance. Effects due to temperature or component variations are well compensated due to the closed loop system. Thus, with the topology of FIG. 1, it is difficult to compensate the information lost in the slow varying frequency content.

Figure 2:
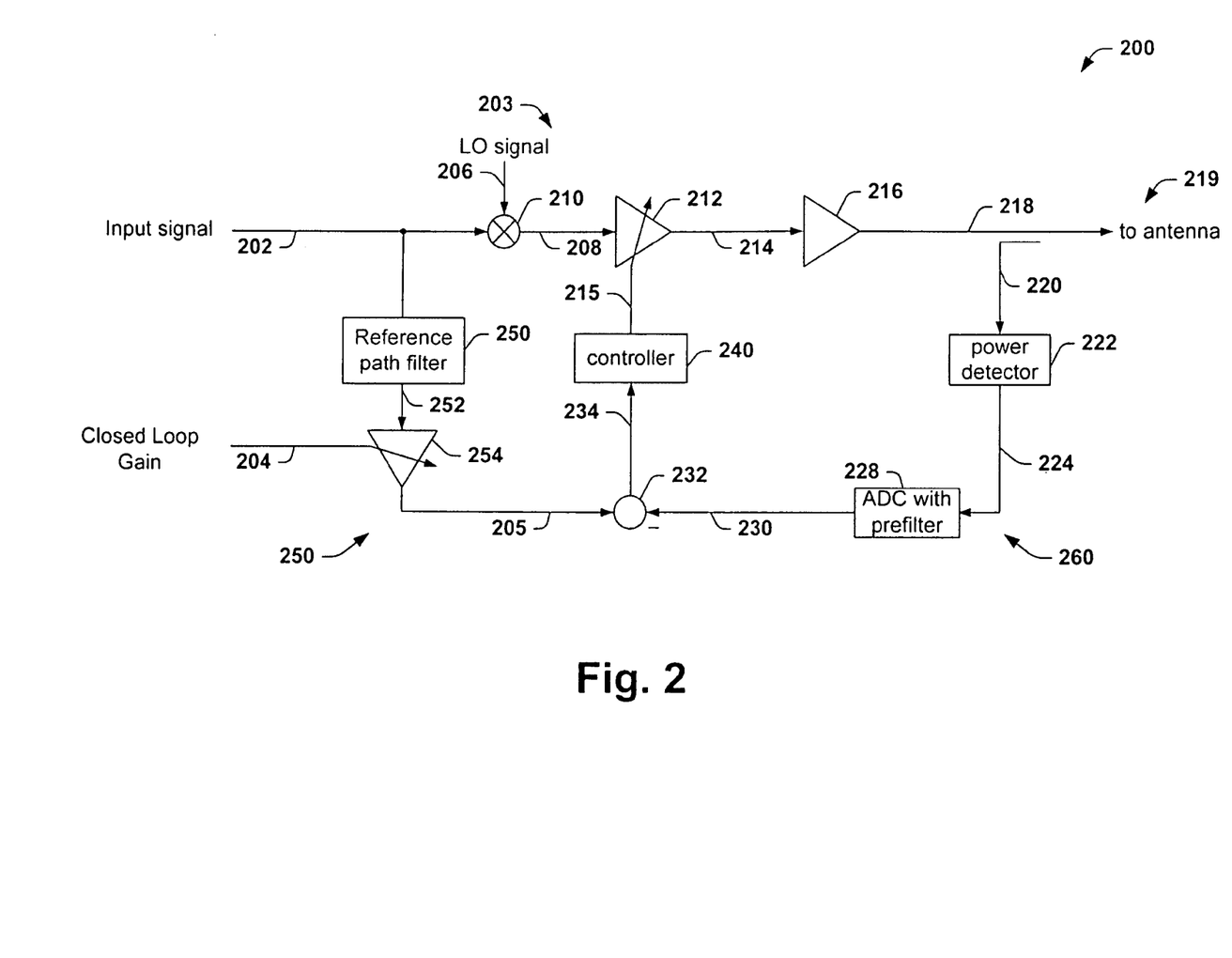
FIG. 2 is a simplified schematic diagram of a closed loop power control system utilizing envelope information for output power control, in accordance with one embodiment of the disclosure.

FIG. 2 illustrates a closed loop power control system 200, utilizing envelope information for control of the output power of the system, in accordance with one embodiment of the disclosure.

While the power control system 200 will be described herein with one or more identified programmable gain amplifiers PGAs, a power amplifier (PA), complex up-converters or mixers, complex filters, a low-pass filters (LPF), a comparator, a detector, an analog to digital converter (ADC), and a digital-to-analog converter (DAC), as one example, it should be understood that many variations of such components and features can be made, and all such variations are contemplated as falling within the scope of the disclosure. Closed loop power gain control can also be carried out by other means also contemplated within the scope of the disclosure.

In one embodiment, the power control system 200 comprises an input signal 202 (e.g., a UMTS, CDMA, WDCMA, GSM, 3GSM, baseband or digital amplitude information signal) that enters a signal path 203, where input signal 202 is up-converted into a modulated RF signal 208 by an RF local oscillator signal 206 utilizing a signal path mixer or up-converter 210. The RF modulated signal 208 is then amplified by signal path amplifier 212, for example, using a programmable gain amplifier (PGA) whose gain is programmably controlled or scaled by an actuator signal 215 to provide an amplified RF modulated output signal or scaled signal path output signal 214. The scaled signal path output signal 214 is then power amplified by power amplifier (PA) 216 to generate an RF transmission signal 218, for example, which is delivered to an antenna 219 (not shown). The antenna 219 coupled to the power amplifier 216, can then be used, for example, to transmit the RF transmission signal 218.

The power control system 200 also has a power detector 222 that detects a power level 224 associated with the RF transmission signal 218, for example, by detecting and demodulating an envelope signal of the RF transmission signal 218. The power control system 200 further includes an analog to digital converter (ADC) 228 coupled to the power detector 222. The ADC 228 pre-filters (e.g., using an anti-aliasing low pass filter), samples and converts the detected envelope signal 224 into a measurement signal 230 (e.g., a digital measurement signal 230).

The power control system 200 also has a reference path filter 250 coupled to the input signal 202, configured to suppress high frequencies in the input signal 202 (e.g., using a low-pass filter) and generate a filtered envelope signal 252. The power control system 200 further includes a reference path amplifier 254 coupled to the reference filter 250 and a (closed loop) gain signal 204 that is configured to scale the filtered envelope signal 252 to the gain signal 204 and generate a reference signal 205 therefrom.

The power control system 200 also includes a comparator 232 that receives the reference signal 205 and subtracts the measurement signal 230 to generate an error signal 234 based on the difference between the reference signal 205 and the measurement signal 230. Finally, the power control system 200 also has a controller 240 coupled between the signal path amplifier 212 and the comparator 232, configured to receive the error signal 234 from the comparator 232 and generate the actuator signal 215 for feedback control of signal path amplifier 212 by scaling the gain of the signal path amplifier 212. The controller may further be configured to integrate and/or low-pass filter the error signal 234 in the generation of the actuator signal 215.

Although one signal path amplifier 212 is illustrated and described herein, two or more programmable gain amplifiers and/or switched mode amplifiers and/or switched mode power amplifiers (SPA) may be utilized in the PGA or signal path amplifier 212 or in power amplifier PA 216. Further, the power amplifier 216 may be combined with or integrated into the signal path amplifier 212 as one or more extra power gain stages of the amplifier, and all such variations and combinations are contemplated herein.

Thus, the power control system 200 is configured to scale the input signal 202 by the actuator signal 215 based on a mismatch between the reference signal 205 generated on a reference signal path 250 and the measurement signal 230 generated on a feedback path 260. In one embodiment, such mismatches would be based on variations in the detected envelope signal 224. Accordingly, the power control system 200 is responsive to low frequencies in the feedback path 260 and may thus be used to monitor a slowly varying amount of envelope information for closed loop power control of the system. For example, such slowly varying envelope information detected in the feedback path 260 is also included in the measurement signal 230. So the error signal 234 is now free of slowly varying envelope information and only responds to the influence of component and temperature variations. In comparison to FIG. 1, the slow varying envelope information is now not removed from the RF transmission signal 218 and improves the quality of the signal compared to the method described in FIG. 1.

By contrast to the power control system 100 of FIG. 1, the power control system 200 of FIG. 2, achieves a better bandwidth matching between the reference signal path 250 and the feedback path 260. For example, in the power control system 100 of FIG. 1, the closed loop gain signal on the reference signal 104 would generally have a constant value compared to the varying measurement signal 130 of the feedback path, thereby producing a large bandwidth mismatch between these signals when compared by comparator 132. By contrast, in the power control system 200 of FIG. 2, the reference signal 205 in the reference path 250 has a dynamic quality provided by the input signal 202 and the reference path filter 250, which more closely matches the bandwidth characteristics of the measurement signal 230 provided by the feedback path 260. Accordingly, comparator 232 of FIG. 2 is able to more easily compare and respond to subtle power variations in the output power of the transmission signal 218, for example.

Figure 3:
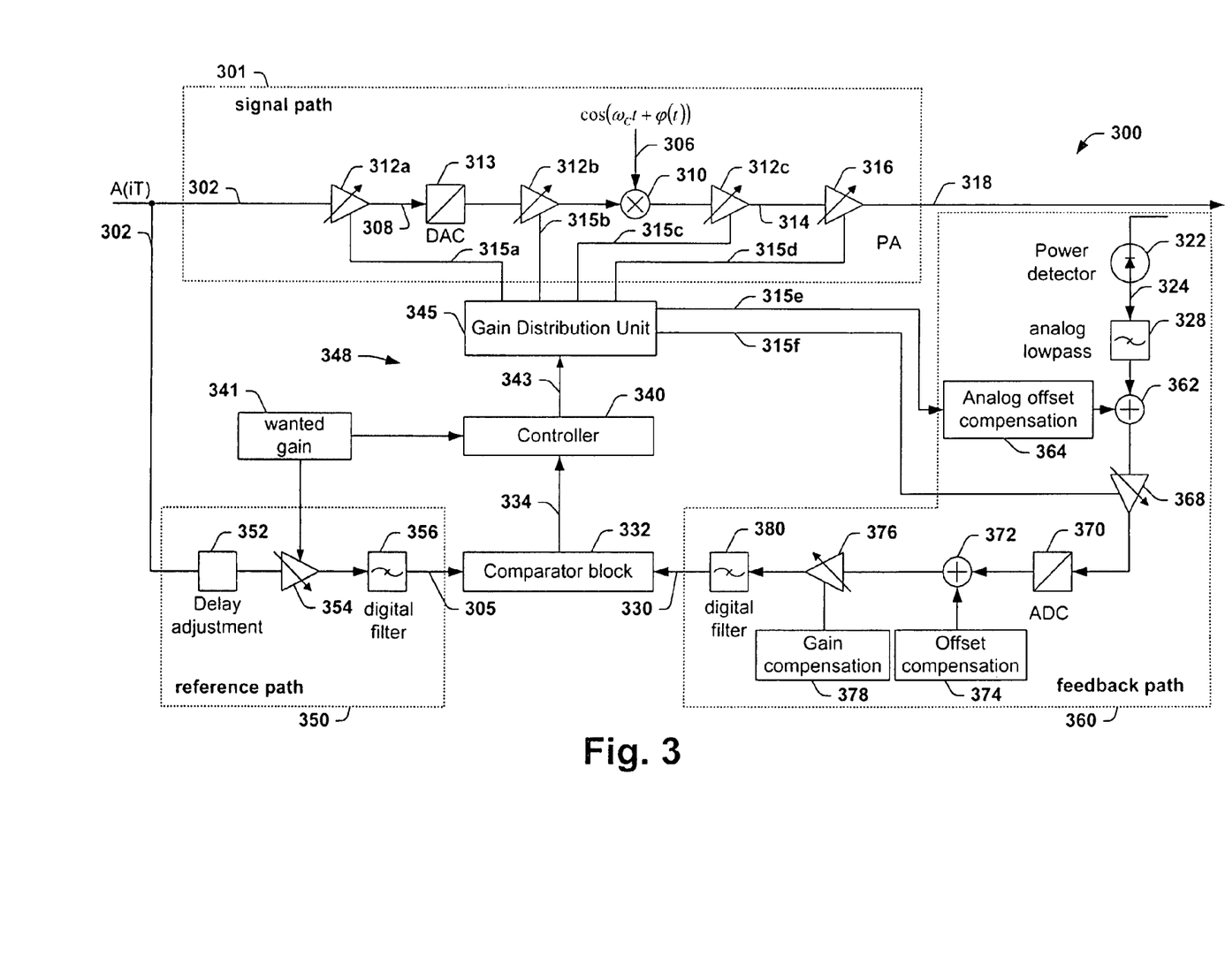
FIG. 3 is a simplified schematic diagram of a closed loop power control system utilizing envelope information for power control of the system, in accordance with one embodiment.

FIG. 3 illustrates a closed loop power control system 300, utilizing envelope information for power control, in accordance with another embodiment. Power control system 300, for example, comprises a signal path 301, a reference path 350 and a feedback path 360, each comprising respective components illustrated and discussed in the following. In the signal path 301 of the power control system 300, the amplitude component A(iT) 302 is amplified by first, second and third signal path PGAs 312a, 312b and 312c, respectively, converted by DAC 313 to an analog signal, and upconverted by a carrier signal 306 using a signal path mixer 310. Power control system 300 may also comprise in the signal path 301, a power amplifier 316 which receives a scaled PGA output signal 314 from the third signal path PGA 312c and generates a transmission signal 318 that may be delivered to an antenna (not shown).

In the reference path 350, power control system 300 also comprises a delay adjustment block 352 coupled to the input signal 302 (e.g., a UMTS, CDMA, WDCMA, GSM, 3GSM, baseband or digital amplitude information signal) to adjustably delay the input signal 302, and a reference path PGA 354 configured to amplify the output of the delay adjustment block 352, which is scaled according to a gain associated with a controller signal 342 supplied to the reference path PGA 354. The reference path 350 of the power control system 300 also includes a digital filter coupled to the scaled reference PGA output signal of the reference path PGA 354, configured to suppress high frequencies in the scaled reference path PGA output signal and to generate a reference signal 305.

The feedback path 360 of power control system 300 comprises a power detector 322 operably coupled to the third signal path PGA 312c, configured to detect a power associated with the scaled PGA output signal 314 (or the transmission signal 318) and generate a detected envelope signal 324 therefrom, an analog low pass filter 328 coupled to the power detector 322 to selectively filter high frequencies from the detected envelope signal 324, an analog offset compensation circuit 364 and a feedback path mixer 362 which are configured to provide offset compensation as needed, an analog to digital converter (ADC) 370 configured to receive, pre-filter and convert the detected envelope signal 324 into a filtered digital measurement signal, and a digital filter 380 coupled to the ADC 370, configured to suppress high frequencies in the digital measurement signal and to generate a measurement signal 330.

The feedback path 360 of power control system 300 may further comprise a feedback path PGA 368 to provide additional signal gain to the detected envelope signal 324, an offset compensation circuit 372 and 374, and a gain compensation circuit 376 and 378 configured to generate offset and gain compensation, respectively, for the digital measurement signal from the ADC 370.

The power control system 300 further comprises a control circuit 348 which includes a comparator block 332 configured to receive the reference signal 305 from the reference path 350 and the measurement signal 330 from the feedback path 360, and generate an error signal 334 based on the difference between the reference signal 305 and the measurement signal 330. The control circuit 348 of the power control system 300 also includes a controller 340 coupled between a gain distribution unit 345 and the comparator block 332 configured to receive the error signal 334 from the comparator block 332 and a wanted gain input signal 341 and generate the control signal 315 operable to control the gain of the gain distribution unit 345. The wanted gain input signal 341 is also operable to control the gain of the reference path PGA 354. The control circuit 348 of the power control system 300 also comprises the gain distribution unit 345 coupled between the controller 340 and the first, second and third signal path PGAs 312a, 312b and 312c, respectively, the gain distribution unit 345 configured to receive the control signal 315 from the controller 340 and generate the actuator signal(s) 315a-315f operable to control the gain of the first, second and third signal path PGAs 312a, 312b and 312c, respectively, based on the error signal 334.

Thus, in accordance with one aspect of the disclosure, the power control system 300 of FIG. 3 thereby provides a digital control loop that utilizes amplitude information from the baseband signal input 302, and a comparator 332 that essentially uses the ratio of the reference signal 305 and the measurement signal 330 and not just the difference of these signals. In another aspect of the power control system 300 of FIG. 3, the controller 340 compensates the gain within the signal path 301 as well as the gain within the reference path 350. In yet another aspect, the gain step response on the reference path 350 and on the signal path 301 plus the feedback path 360 are matched.

In operation, the digital amplitude information A(iT) 302 is converted to an analogue signal which goes through a chain of buffers, mixers (e.g., one or more mixers, depending on the transmit architecture) and RF amplifiers (e.g., PGAs 312a, 312b and 312c) until it reaches the power amplifier PA 316. The power detector 322 generates an analogue signal whose amplitude is proportional to the power of the forward traveling RF wave. One embodiment of a power detector 322 may comprise an RF coupler having a high directivity and a peak detector. This detected envelope signal 324 contains at least part of the original amplitude modulation information A(iT) 302 and can be advantageously low pass filtered, for example, by filter 328 in order to limit the bandwidth of the signal, the timing requirements between the reference path 350 and the feedback path 360 in relation to the amplitude modulation (which is different from timing requirements on the applied gain steps), and the requirements on the envelope accuracy of the power detector 322 (e.g., zero crossings due to modulation distort the envelope signal, if amplified with a limited bandwidth).

The resulting detected envelope signal is then sampled by an ADC 370, digitally compensated for a remaining offset and a gain error (e.g., using gain compensation circuit 376/378 and offset compensation circuit 372/374), which may be introduced by the power detector 322, but may also be due to the ADC 370 or the analogue low pass filter 328. If the ADC 370 and the analogue low pass work ideally, the gain and offset compensation could be summarized to an inverse power detector. To achieve a perfect matching between the reference path and the feedback path (mainly due to process tolerances of the analogue low pass filter 328) the signal is filtered with a digital filter 380 before it enters the comparator block 332. The digital filter stage 380 can also be used to increase the quantization within the feedback path 360. Due to the linearity of the feedback path 360 the order of the blocks may be rearranged, as it may only change the linearity requirements for the blocks.

The reference path 350 has two inputs: the digital amplitude input A(iT) 302 and the gain provided by the controller signal 342 delivered from the controller 340. Conventional systems would typically apply the wanted gain 341 directly to the reference path 350, but in the closed loop power control system 300 concept due to the settling time requirement of the entire system, the gain on the reference path 350 is additionally modified by the controller 340. The digital amplitude is first delay adjusted using delay adjustment 352, amplified by reference path PGA 354 to the expected output signal and then processed with a digital filter 356 whose step response is similar to the cascade of the filters present in the feedback path 360. In the feedback path 360, the order of the circuit blocks aids in the reduction of the settling time of the whole system, as described further below.

Ideally, the output signals (e.g., 305 and 330) on the reference path 350 and feedback path 360, respectively, seek to achieve nearly identical bandwidth characteristics. However, in real world this goal is not so easily achieved, and that is why the power control system 300 of FIG. 3 is needed.

The comparator block 332 compares the reference signal 305 to the measurement signal 330, and generates the error signal 334 according to the following explanation. The gain of a simple amplifier for example is defined as ratio of the output signal compared to the input signal. This idea behind this principle suggests one possible implementation for the comparator block 332 as represented in FIG. 4.

Figure 4:
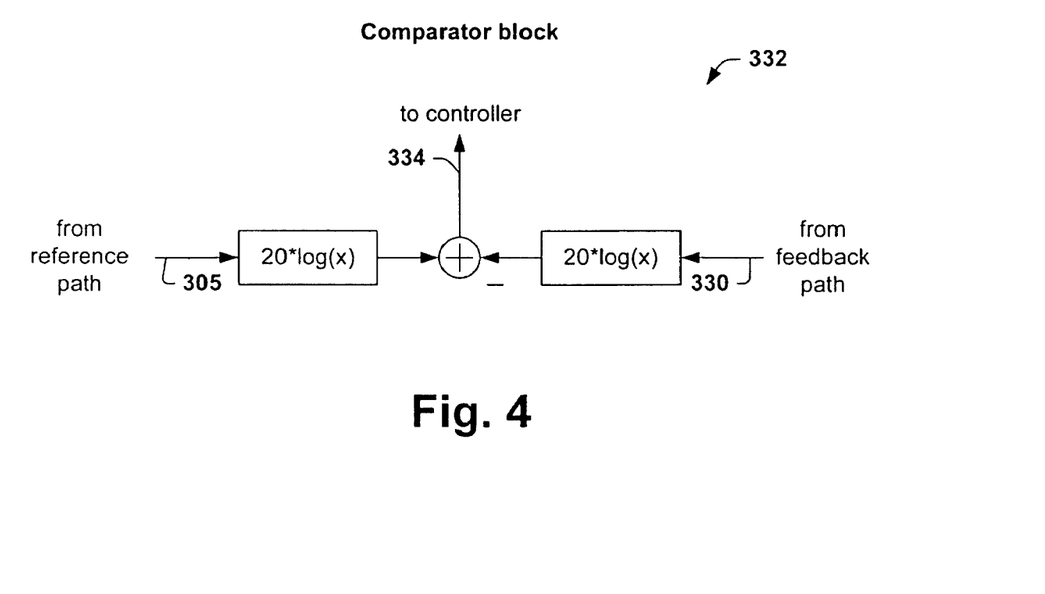
FIG. 4 is a simplified comparator block such as may be used in the closed loop power control system of FIG. 3, in accordance with one embodiment.

For example, FIG. 4 illustrates a simplified comparator block 332 such as may be used in the closed loop power control system 300 of FIG. 3, in one embodiment.

In another embodiment, the ratio could be calculated directly without the use of a logarithm of the reference signal 305 from the reference path 350 and the measurement signal 330 from the feedback path 360. The error signal 334 from the comparator block 332 is now essentially the gain error between the reference path 350 and the feedback path 360. The advantage of this topology is that the error signal 334 at the output of the comparator block 332 is only a function of the gain error between the two different paths and not dependent on the reference or feedback amplitude as compared to traditional control concepts. The error signal 334 may then be fed directly into the controller 340.

The controller 340 is configured to combine the wanted gain 341 and the error signal 334 from the comparator block 332.

Figure 5:
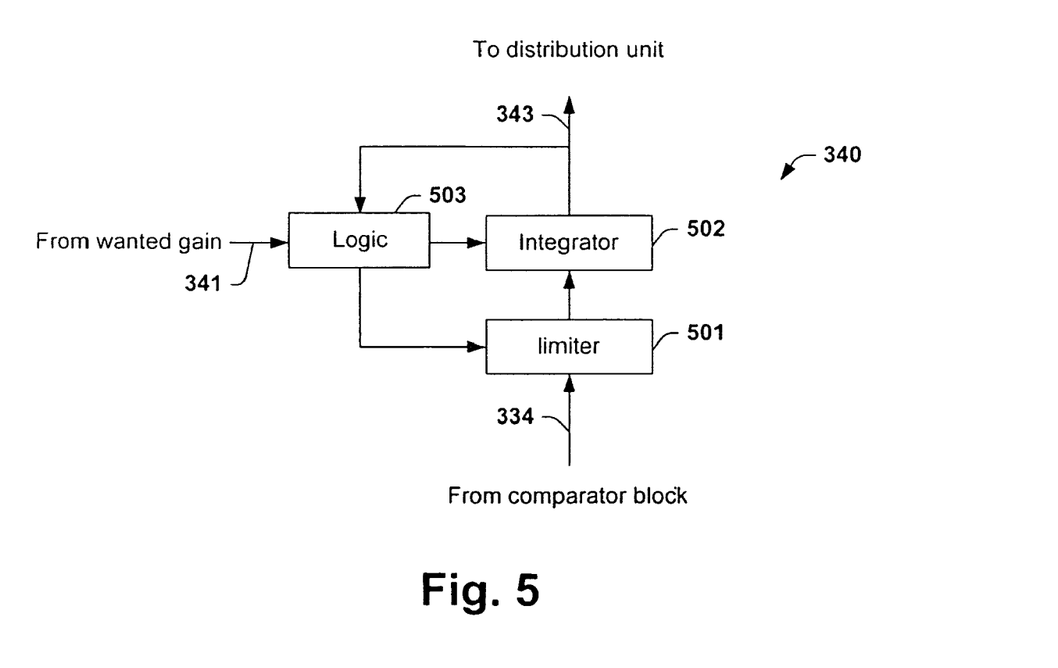
FIG. 5 is a simplified block diagram of one embodiment of a controller such as may be used in the closed loop power control system of FIG. 3, in accordance with one embodiment of the disclosure.

FIG. 5, for example, illustrates a simplified block diagram of one embodiment of a controller 340, such as may be used in the closed loop power control system 300 of FIG. 3.

Figure 6:
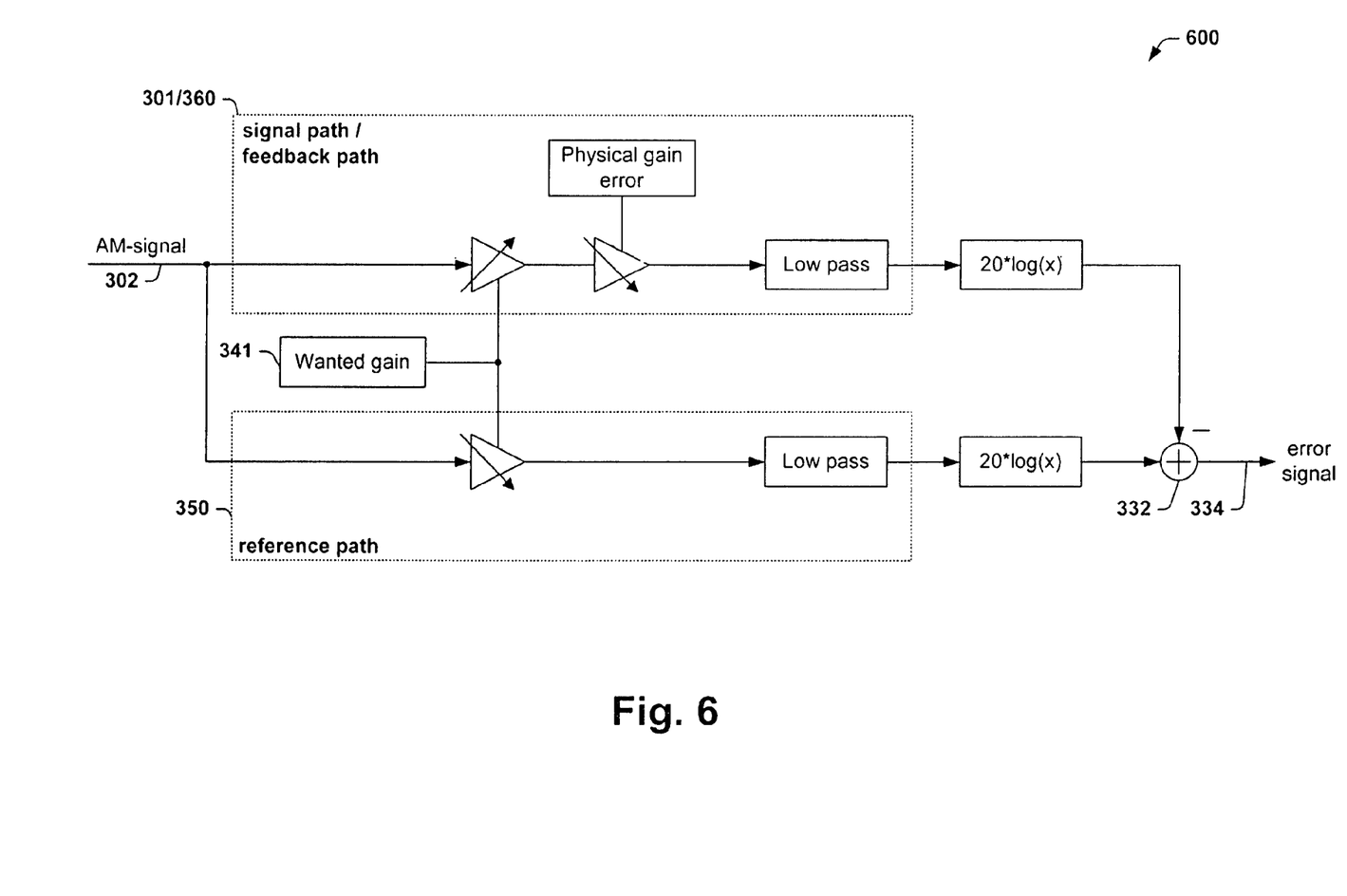
FIG. 6 is a simplified block diagram to explain the performance of a logarithmic comparator block as shown in FIG. 4.

FIG. 6 illustrates the behavior 600 on the error signal when the comparison block contains logarithmic blocks. If a wanted gain is applied at time equal to zero, the AM-signal 302 will be immediately amplified as expected. In the signal path 301/feedback path 360 the presence of an additional physical gain error (e.g., 334) scales the AM-signal 302 differently than the reference path 350. After low pass filtering and logarithm on each path, the error signal 334 will generally correspond to the physical gain error (e.g., −6 dB).

Advantageously, in the power control systems 200 of FIG. 2 and 300 of FIG. 3, the error signal is available even during the settling of the filters on each path (reference path 350 and signal path 301/feedback path 360, or reference path 350. If needed, the controller 300 response rate may be increased, only limited by the accuracy of the digital implementation and the matching between the reference path 350 and the feedback path 360. Accordingly, the controller 340 generally seeks to time synchronize the same gain step on the reference path 350 and on the signal path 301, and correct the error signal 334 if necessary so that it corresponds to the physical gain error.

Another issue, which the controller 340 seeks to address, occurs when the detector dynamic range is smaller than the prescribed dynamic range. The APC loop must be deactivated for power levels that are outside the operating range of the feedback path 360, which are mainly determined by the power detector 322. In this case the system 300 works in open loop mode and the set value of the controller 340 becomes the wanted gain 341 without any further modification even if an error signal 334 is present.

In closed loop mode, the set value delivered to the gain distribution unit 345 is a function of the wanted gain 341 and the error signal 334. Care must be taken in order to ensure a smooth transition when switching between those two modes. Accordingly, another embodiment includes the controller 340 of FIG. 5 that limits the range of deviation from the wanted gain. In closed loop mode the gain range for the limitation is opened to its maximum value and in open loop mode the gain range of the limitation is reduced to 0. Thus one embodiment of the controller 340 of FIG. 5 fulfils both requirements (fast settling/smooth open-closed loop transition).

During operation of the controller 340 of FIG. 5, the error signal 334 is delivered from the comparator block 332 and corresponds to the physical gain error. A limiter 501 is necessary to guarantee a smooth transition between the open loop mode and closed loop mode, as explained above. In the open loop mode, the limiter 501 is set to zero and forces the integrator 502 to operate with the wanted gain 341 as directed by logic circuit 503. In closed loop mode the limiter 501 is used to control the maximum deviation from the wanted gain 341. The gain 343 is then applied on the distribution unit 345.

The gain distribution unit 345 is configured to appropriately set the gain of each block of the transmit chain (e.g., first, second and third signal path PGAs 312a-312c and PA 316), so that the output power level (e.g., on transmission signal 318) is accurate. The input of this block is only the set value from the controller 340. In one embodiment, the gain distribution unit 345 regulates one or more of the following: the amplitude of the digital amplitude information 308 at the input of DAC 313, the amplitude of the baseband AM analogue signal 302 (with a programmable gain chain, or a combination of a DAC and a VGA), the amplitude of the RF signal after the signal path mixer 310 (with a programmable gain chain, or a combination of a DAC and a VGA), and the gain of the PA 316. In one embodiment of the power control system (e.g., 300), one or more of the proposed control or gain stages may be not implemented.

Calibration of the power control systems of FIGS. 2 and 3 can be done easily. Only two constant envelope signals are necessary to calibrate for the two parameters (gain compensation and offset compensation) within the power control operation which is independent of the modulation scheme.

Thus, in accordance with the disclosure, one or more of the power control systems (e.g., 200 of FIG. 2 or 300 of FIG. 3, respectively) described herein are operable to provide one or more or a combination of the following: a digital control loop using amplitude information from or associated with the baseband, a comparator (e.g., 232 or 332) that uses the ratio and not the just the difference of the reference signal (e.g., 205 or 305) and the measurement signal (e.g., 230 or 330), a controller (e.g., 240 or 340) responsive to the gain on signal path (e.g., 203 or 301) as well as the gain on a reference path (e.g., 250 or 350), a gain step response on the reference path (e.g., 250 or 350) and on the signal path (e.g., 203 or 301) plus feedback path (e.g., 260 or 360) are matched.

The power control systems (e.g., 200 of FIG. 2 or 300 of FIG. 3, respectively) described herein are suitable for use in wideband communication systems including wireless or wireline technologies, for both mobile and base station use, or where power control systems are required conforming to UMTS, CDMA, WCDMA, GSM, 3GSM and other communications standards, as well as in RF power control systems requiring output power control.

Although single filters are shown in FIGS. 2 and 3, filters 250, the pre-filter portion of ADC 228, digital filter 356 and 380, or analogue low-pass filter 328 may individually comprise one or more filters. Similarly, although a single PGA of signal path amplifier 212 is shown in FIG. 2, signal path amplifier 212 may individually comprise one or more amplifiers, switches, switched mode amplifier or another suitable RF switching circuit, for example, and as such are contemplated within the scope of the disclosure.

In addition to or in substitution of one or more of the illustrated components, the illustrated PGAs, power amplifiers, controllers, gain distribution unit, and other systems of the disclosure may include suitable circuitry, state machines, firmware, software, logic, etc. to perform the various methods and functions illustrated and described herein, including but not limited to the method(s) described below.

In one embodiment, a method is disclosed for closed loop power control (e.g., actuator signal 215 controlling the gain of PGA 212 of FIG. 2) of an input signal (e.g., 202 of FIG. 2) such as a UMTS input signal based on slow varying envelope information associated with the UMTS signal.

The method includes suppressing high frequencies (e.g., using reference path filter 250 of FIG. 2) in an input signal (e.g., 202 of FIG. 2) to generate a filtered envelope signal (e.g., 252 of FIG. 2), scaling (e.g., using reference path amplifier 254 of FIG. 2) the filtered envelope signal 252 with a closed loop gain 204 to generate a reference signal 205 therefrom, and amplifying (e.g., using PGA 212 of FIG. 2) an RF modulated signal 208 to generate an amplified signal path output signal 214 scaled by a gain of an actuator signal 215. The method also includes detecting (e.g., using power detector 222 of FIG. 2) a power 220 associated with the amplified and RF modulated signal 218 to generate a detected power signal 224 therefrom, and converting (e.g., using ADC 228 of FIG. 2) the detected power signal 224 into a measurement signal 230. Finally, the method further includes generating an error signal 234 (e.g., using comparator 232 of FIG. 2) based on a difference between the reference signal 205 and the measurement signal 230, and generating the actuator signal (e.g., using controller 240 of FIG. 2) for controlling the gain of the amplified signal path output signal 214 based on the error signal 234.

In another embodiment, the method further comprises mixing to up-convert (e.g., using signal path mixer 210 of FIG. 2) the (e.g., UMTS) input signal 302 with a local oscillator signal 206, before amplifying (e.g., using PGA 212 of FIG. 2) the RF modulated signal 202.

Although the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A closed loop power control system, comprising:
   a reference path filter coupled to an input signal, configured to suppress high frequencies in the input signal and to generate a filtered envelope signal;
   a reference path amplifier coupled to the reference path filter and a gain signal, configured to scale the filtered envelope signal based on the gain signal and generate a reference signal therefrom;
   a signal path amplifier, configured to receive and amplify an RF modulated signal, and generate a signal path output signal scaled by a gain of an actuator signal;
   a power detector configured to detect a power associated with the scaled signal path output signal and to generate a detected envelope signal therefrom;
   an analog to digital converter (ADC) coupled to the power detector configured to receive, pre-filter and convert the detected envelope signal into a measurement signal;
   a comparator block configured to receive the reference signal from the reference path amplifier and the measurement signal from the ADC, and generate an error signal based on the difference between the reference signal and the measurement signal; and
   a controller coupled between the signal path amplifier and the comparator block, configured to receive the error signal from the comparator block and generate the actuator signal operable to control the gain of the signal path amplifier based on the error signal.

2. The power control system of claim 1, comprising a power amplifier coupled to the signal path amplifier, configured to amplify the power of the scaled signal path output signal and generate an RF transmission signal.

3. The power control system of claim 2, comprising an antenna coupled to the power amplifier, configured to transmit the RF transmission signal.

4. The power control system of claim 2, wherein the power amplifier comprises two or more switched mode power amplifiers.

5. The power control system of claim 1, comprising a signal path mixer configured to up-convert the input signal at the reference path filter with a local oscillator signal, and to supply the RF modulated signal result therefrom to the signal path amplifier.

6. The power control system of claim 1, wherein the input signal is modulated according to one of a UMTS, CDMA, WDCMA, GSM and 3GSM standard.

7. The power control system of claim 1, wherein the controller is configured to integrate and low-pass filter the error signal in the generation of the actuator signal.

8. The power control system of claim 1, wherein the controller is configured to integrate the error signal in the generation of the actuator signal.

9. The power control system of claim 1, wherein the analog to digital converter comprises a low-pass pre-filter.

10. The power control system of claim 1, wherein the control system is configured to scale the UMTS input signal by the actuator signal based on a mismatch between the reference signal generated on a reference signal path and the measurement signal generated on a feedback path.

11. A closed-loop power control system, comprising:
a reference path comprising
  a delay adjustment block coupled to a baseband input signal, configured to adjustably delay the baseband input signal;
  a reference path programmable gain amplifier (PGA), configured to receive and amplify the delayed baseband input signal, and generate a reference path PGA output signal scaled by a gain associated with a controller signal; and
  a digital filter coupled to the scaled reference PGA output signal, configured to suppress high frequencies in the scaled reference path PGA output signal and to generate a reference signal;
a signal path comprising
  first, second and third signal path PGAs, configured to receive and amplify one of the baseband input signal and an RF modulated signal, scaled by respective first, second and third gain signals, the third signal path PGA further configured to provide a scaled PGA output signal at an output of the third signal path PGA;
  a digital to analog converter (DAC) coupled between the first and second signal path PGAs, configured to convert the digital components of the amplified baseband input signal from the first signal path PGA to an analog baseband input signal which is amplified by the second signal path PGA; and
  a signal path mixer coupled between the second and third signal path PGAs, configured to up-convert the amplified analog baseband input signal from the second signal path PGA with a local oscillator signal (complex carrier signal), and to supply an RF modulated signal result therefrom to the third signal path PGA;
a feedback path comprising
  a power detector coupled to the third signal path PGA, configured to detect a power associated with the scaled PGA output signal and to generate a detected envelope signal therefrom;
  an analog to digital converter (ADC) coupled to the power detector configured to receive, pre-filter and convert the detected envelope signal into a filtered digital measurement signal; and
  a digital filter coupled to the analog to digital converter, configured to suppress high frequencies in the digital measurement signal and to generate a measurement signal;
a control circuit comprising
  a comparator block configured to receive the reference signal from the reference path and the measurement signal from the feedback path, and generate an error signal based on the difference between the reference signal and the measurement signal;
  a controller coupled between a gain distribution unit and the comparator block configured to receive the error signal from the comparator block and a wanted gain input signal and generate the control signal operable to control the gain of the gain distribution unit and the controller signal operable to control the gain of the reference path PGA based on the error signal; and
  the gain distribution unit coupled between the controller and the first, second and third signal path PGAs, configured to receive the control signal from the controller and generate the actuator signal operable to control the gain of the first, second and third signal path PGAs based on the error signal.

12. The power control system of claim 11, comprising a power amplifier coupled to the output of the third signal path PGA, configured to amplify the power of the scaled PGA output signal.

13. The power control system of claim 11, wherein the feedback path further comprises a gain compensation circuit and an offset compensation circuit, configured to generate a gain and offset compensation for the digital measurement signal.

14. The power control system of claim 11, comprising an antenna coupled to the output of the third signal path PGA, configured to transmit the scaled PGA output signal.

15. The power control system of claim 11, wherein the input signal is modulated according to one of a UMTS, CDMA, WDCMA, GSM and 3GSM standard.

16. The power control system of claim 11, wherein the feedback path further comprises an analogue offset compensation circuit, configured to generate analogue offset compensation for the filtered digital measurement signal.

17. A power control system, comprising:
reference path filtering means operable to suppress high frequencies in a baseband input signal and to generate a filtered baseband signal;
amplifying means operable to scale the filtered baseband signal based on a closed loop gain and generate a reference signal therefrom;
amplifying means operable to amplify an RF modulated signal and generate an amplified output signal scaled by a gain of an actuator signal;
power detecting means operable to detect a power associated with the amplified and RF modulated signal and generate a detected envelope signal therefrom;
converting means operable to receive, pre-filter and convert the detected envelope signal into a measurement signal;
comparing means operable to generate an error signal based on a difference between the reference signal and the measurement signal; and controlling means operable to receive the error signal and generate the actuator signal operable to control the gain of the amplifying means based on the error signal.

18. The power control system of claim 17, comprising power amplifying means operable to amplify the power of the amplified output signal to generate a transmission signal.

19. The power control system of claim 18, comprising a transmitting means operable to transmit the transmission signal generated by the power amplifying means.

20. The power control system of claim 17, comprising a mixing means operable to up-convert the baseband input signal with a local oscillator signal, and to supply the RF modulated signal result to the amplifying means.

21. A method for closed loop power control of an input signal based on slow varying envelope information associated with the input signal, the method comprising:
suppressing high frequencies in a input signal to generate a filtered envelope signal;
amplifying the filtered envelope signal with a closed loop gain to generate a reference signal therefrom;
amplifying an RF modulated signal to generate an amplified output signal scaled by a gain of an actuator signal;
detecting a power associated with the amplified and RF modulated signal to generate a detected envelope signal therefrom;
converting the detected envelope signal into a measurement signal;
generating an error signal based on a difference between the reference signal and the measurement signal; and
generating the actuator signal for controlling the gain of the amplified output signal based on the error signal.

22. The method of claim 21, comprising mixing to up-convert a UMTS input signal with a local oscillator signal, before amplifying the RF modulated envelope signal.

* * * * *